United States Patent [19]
Yashita et al.

[11] Patent Number: 5,753,964
[45] Date of Patent: May 19, 1998

[54] SEMICONDUCTOR DEVICE FOR A MOTOR DRIVING CIRCUIT

[75] Inventors: Takahiro Yashita; Keisuke Kawakita; Hideki Miyake, all of Tokyo, Japan

[73] Assignees: Mitsubishi Denki Kabushiki Kaisha; Mitsubishi Electric Engineering Co., Ltd., both of Tokyo, Japan

[21] Appl. No.: 731,466

[22] Filed: Oct. 15, 1996

[30] Foreign Application Priority Data

Apr. 19, 1996 [JP] Japan ................ 8-098544

[51] Int. Cl.⁶ ............................. H01L 29/00
[52] U.S. Cl. ............................. 257/547
[58] Field of Search ............... 257/500, 544, 257/546, 547, 550, 552, 553

[56] References Cited

U.S. PATENT DOCUMENTS

| | | |
|---|---|---|
| 4,905,067 | 2/1990 | Morelli et al. ............ 257/547 |
| 5,021,860 | 6/1991 | Bertotti et al. ............ 257/552 |
| 5,545,917 | 8/1996 | Peppiette et al. ......... 257/552 |

FOREIGN PATENT DOCUMENTS

| | | | |
|---|---|---|---|
| 402020056 A | 1/1990 | Japan ............ | 257/544 |
| 2-58350 | 2/1990 | Japan . | |
| 403064959 A | 5/1991 | Japan ............ | 257/544 |
| 4329665 | 11/1992 | Japan . | |

*Primary Examiner*—Tom Thomas
*Assistant Examiner*—Fetsum Abraham
*Attorney, Agent, or Firm*—Leydig, Voit & Mayer, Ltd.

[57] ABSTRACT

A semiconductor integrated circuit device for driving a motor and including a p-type semiconductor substrate having spaced apart first and second areas; power transistors in the semiconductor substrate within the first area; a small signal system circuit in the semiconductor substrate within the second area; and an n-type isolating region in the semiconductor substrate separated from the first and second areas and disposed at least partially between the first and second areas, the n-type isolating region being connected to ground.

26 Claims, 12 Drawing Sheets

SEMICONDUCTOR DEVICE FOR A MOTOR DRIVING CIRCUIT

BACKGROUND OF THE INVENTION

1. Field of the Invention

The invention relates to a semiconductor device for driving an inductive load such as a motor which includes inductive coils.

2. Description of the Prior Art

FIG. 7 shows an example of a motor driving circuit 100. In FIG. 7, the motor driving circuit comprises power transistors Q1, Q2, Q3 on a power supply source side and power transistors Q4, Q5, Q6 on a ground side. FIG. 7 also shows a motor 200 comprising output terminals MU, MV, MW, coils of respective phases LU, LV, LW, and a motor driving power supply source terminal VM. In the motor driving circuit shown in FIG. 7, the power transistors are connected in three phases, the transistor Q1 and the transistor Q4 are connected in series, a collector electrode of the transistor Q1 is connected to the motor driving power supply source terminal VM, a junction node W of the transistors Q1 and Q4 is connected to the terminal MW of the W-phase coil winding LW of the motor 200 through a terminal 23, and an emitter of the transistor Q4 is connected to the ground through a resistor 17.

In the same way, the transistor Q2 and the transistor Q5 are connected in series, where a collector electrode of the transistor Q2 is connected to the motor driving power supply source terminal VM, a junction node V of the transistor Q2 and the transistor Q5 is connected to the terminal MV of the V-phase coil winding LV of the motor 200 through a terminal 22, and an emitter of the transistor Q5 is connected to the ground through the resistor 17. Furthermore, in the same way, the transistor Q3 and the transistor Q6 are connected in series, where a collector electrode of the transistor Q3 is connected to the motor driving power supply source terminal VM, a junction node of the transistors Q3 and Q6 is connected to the terminal MU of the U-phase coil winding LU of the motor 200 through a terminal 21, and an emitter of the transistor Q6 is connected to the ground through the resistor 17.

With this connection, a small signal circuit portion 40 which will be mentioned below turns the transistors Q3 and Q5 on and the other transistors Q1, Q2, Q4, Q6 off which causes a current flow in a direction from the coil LU to the coil LV of the motor 200 which serves as a load. The coils LU and LV generate a magnetic field in a constant direction which causes the rotor comprised of permanent magnets to rotate in the direction of rotation of this magnetic field.

FIG. 8 shows a state changed from that shown in FIG. 7 where the transistor Q3 turns off, and the transistor Q1 turns on. In this state, the current changes its direction and flows from the coil LW to the coil LV of the motor 200 and the current which has been flowing through the coil LU stops. Because of an inductive energy stored in the coil LU, the terminal 21, which is on a collector side (the node U) of the transistor Q6, changes to a negative voltage.

FIG. 9 shows an output voltage waveform of a phase U (the terminal 21) of the motor driving circuit. FIG. 10 shows an example of a plan view of a conventional semiconductor device for the motor driving.

In FIG. 10, the semiconductor device comprises a motor driving circuit 100, power transistors Q1–Q3 on the power supply source side, power transistors Q4–Q6 on the ground side, a chip end 3 of a substrate, alminum wiring-board 5, 6, 8, 9, 14 for wiring, epitaxial layers 10 of the power transistors on the ground side, epitaxial layers 11 of the power transistors on the power supply source side, an epitaxial layer 12 of an N-type island, a resistor 17, a small signal circuit portion 40, an epitaxial layer 30 for resistors in the small signal circuit portion 40, and an epitaxial layer 31 for transistors in the small signal circuit portion 40. Although the small signal circuit portion 40 comprises various circuits, one example such as the resistive portion 30 and the transistor portion 31 is illustrated in the small signal circuit portion 40 as shown in FIG. 10.

FIG. 11 shows a cross-sectional view of a semiconductor integrated circuit device taken along a line 11—11 in FIG. 10. In FIG. 11, the semiconductor integrated circuit device comprises a P-type substrate 1, an embedded layer 2, a chip end 3 of the substrate 1, separating layers 25, 26, 27, 28, 29, alminum wiring-boards 5–9 for wiring, an epitaxial layer 10 of the power transistor on the ground side, an epitaxial layers 11 of the power transistor on a power supply source side, an epitaxial layer 12 of an N-type island, a glass coating layer 13, an alminum wiring-board 14, penetrating layers 15, an inter-layer film 16, a penetrating layer 19, an insulating layer 18, a parasitic transistor QS, parasitic resistances Rcs1–Rcs3, Rcs, and parasitic currents $I_{C1}$–$I_{C3}$, $I_{CS}$.

In FIG. 10 and FIG. 11, the respective collector electrodes of the power transistors Q1–Q3 are connected to the alminum wiring-board 8 via the penetrating layer 15 which penetrates the insulating layer 18, and to the motor driving power supply source terminal VM via the alminum wiring-board 8. Respective bases of the power transistors Q1–Q6 are connected to the alminum wiring-boards via the penetrating layer 15 in the insulating layer 18, then connected to control signal supply circuits 45–50 which will be mentioned below. For simplification of the drawings, detailed illustration is omitted.

On the other hand, the emitter electrodes of the power transistors Q4–Q6 are connected to the ground via the penetrating layer 15 which penetrates the insulating layer 18, the alminum wiring-board 6, and the resistor 17. Alternatively, respective emitter electrodes of the power transistors Q1–Q3 and collector electrodes of the power transistors Q4–Q6 are connected to the alminum wiring-board 14 via the penetrating layer 15 which penetrates the insulating layer 18 and the penetrating layer 19. The emitter electrodes of the power transistors Q1–Q3 are connected to the collector electrodes of the power transistors Q4–Q6 by the alminum wiring-board 14. This alminum wiring-board 14 is further connected to the terminals 21–23 by drawing lines.

The N-type epitaxial layer 12 is connected to a power supply source Vcc via the penetrating layer 15 which penetrates the insulating layer 18 and the alminum wiring-board 9. The epitaxial layer 30 for the resistors and respective elements for the transistors provided in the epitaxial layer 31 in the small signal circuit portion 40 are respectively and properly connected via the penetrating layer 15 which penetrates the insulating layer 18 and the alminum wiring-boards. For simplification of the drawing, detailed illustration is omitted.

Next, an operation of the parasitic transistor is explained using FIGS. 7–11. When the transistors Q3, Q5 of the motor driving circuit 100 remains turn-on, current flows in the direction from the coil LU to the coil LV of the motor 200, and also the voltage of the terminal 21 is V, and if the current suddenly changes its direction and flows from the coil LW to the coil LV of the motor 200 according to the control of the motor driving circuit 100, the current flowing through the coil LU suddenly stops, and the inductive energy stored in the coil LU is discharged through a parasitic diode formed between the epitaxial layer of the transistor Q6 and the substrate. In this way, when the transistor Q3 turns off, the transistor Q1 turns on, the current flowing through the coils changes direction, and a collector voltage of the transistor Q6 transiently turns from the positive voltage (+V) to a negative voltage, as shown in FIG. 9.

As shown in FIG. 11, since a potential of an emitter side is lower than that of a base side in the NPN parasitic transistor QS formed between the N epitaxial layer of the transistor Q6 and the epitaxial layer of the transistor Q3, where both of the transistors Q6, Q3 are formed on both sides of the grounded separating area 26, the NPN parasitic transistor QS turns on. This parasitic NPN transistor QS draws a collector current $I_C$ from surrounding epitaxial layers. This collector current $I_C$ is larger for the epitaxial layer being closer to the NPN parasitic transistor QS, and smaller for the epitaxial layer being farther from the NPN parasitic transistor QS.

This current $I_C$ comprises the current $I_{C1}$ from the epitaxial layers 11 of the adjacent transistor Q3, the current $I_{C2}$ from the epitaxial layer 12 comprising the next N-type island, the current $I_{C3}$ from the epitaxial layer 30 comprising the next resistor, and the current $I_{CS}$ from the epitaxial layer 31 comprising the next small signal circuit portion 40, for example. The sum of these currents ($I_{C1}$, $I_{C2}$, $I_{C3}$, $I_{CS}$) constitute the current $I_C$. In other words, the current $I_C$ is obtained as $I_C=I_{C1}+I_{C2}+I_{C3}+...+I_{CS}$. Where, the resistances Rcs1–Rcs3, Rcs formed at respective epitaxial layers constitutes serial components of collector resistance of the parasitic NPN transistor. The farther the epitaxial layers are from the power transistors, the larger the serial component of the collector resistance Rc becomes. As shown in FIG. 11, since the epitaxial layer 31 in the small signal circuit portion 40, which is most seriously influenced by the current being drawn from the parasitic NPN transistor, is located far from the power transistor, the resistance Rc can be increased, which can decrease the current $I_{CS}$.

FIG. 12 shows a pattern of the small signal circuit portion 40 on a semiconductor. In FIG. 12, the small signal circuit portion 40 comprises a 120° matrix 41, a control amplifier (CTL AMP) 42, a three-differential amplifier 43, an auxiliary circuit 44 (TSD (Thermal Shut Down), etc.), control signal supply circuits 45–48. It is noted that different elements and the different arrangement of these elements can be used according to a motor to be controlled. The small signal circuit portion 40 is provided by signals corresponding to rotor locations from Hall elements installed in the motor 200, and controls the conducting period of the power transistors Q1–Q6 in the motor driving circuit 100 according to the detected rotor locations.

The small signal circuit portion 40 controls the bases of the power transistors Q1–Q6 in the motor driving circuit 100 via the three-differential amplifier 43 and the control signal supply circuits 45–50, by computing the time-location relationship between respective phases, in response to the location signals Hu+, Hu−, Hv+, Hv−, Hw+, Hw− received from the Hall elements installed in the motor. Where, the control amplifier 42 controls the three-differential amplifier 43 by the control signals from the control apparatus such as a computer. The auxiliary circuit 44 comprises an auxiliary apparatus such as a temperature protecting circuit, a constant voltage source, and a power supply source circuit, for example.

As explained above, in the semiconductor integrated circuit, the parasitic transistor QS operates when the collector potential of the NPN transistor is lower than the ground potential. When parasitic transistor operates, it draws current $I_{C1}$ from the epitaxial layers 11 of the adjacent transistors Q1–Q3, the current $I_{C2}$ from the epitaxial layer 12 of the next N-type island, the current $I_{C3}$ from the epitaxial layer 30 of the next resistor, and the current $I_{CS}$ from the epitaxial layer 31 of the next small signal circuit portion 40.

In the conventional semiconductor integrated circuit, the NPN transistor having a collector connected to the power supply source or the N-type island 12 is located between the epitaxial layer 31 in the circuit treating the small signals and the epitaxial layer 10 in the NPN power transistor where the collector potential can be lower than the ground potential. At the same time, in the small signal circuit portion 40, the elements (such as a resistor, see the epitaxial layer 30 in FIG. 11), whose epitaxial layer connected to the power supply source, are located in the direction of the power transistor. In this way, the largest part of the current $I_C$ required by the parasitic transistor is supplied by the epitaxial layer with low impedance connected to the power supply source such as the N-type epitaxial layer 12, while the smallest part of the current $I_{CS}$ is supplied by the epitaxial layer in the small signal circuit portion with high impedance. Therefore, it is possible to reduce the effect of the parasitic transistor on the small signal circuit portion 40 to some extent.

However, in the conventional semiconductor integrated circuit, the problem is that power consumption of the NPN parasitic transistor QS is large because the collector current required by the parasitic transistor is provided from the power supply source.

SUMMARY OF THE INVENTION

It is an object of the present invention to decrease the power consumption of the semiconductor integrated circuit device which has power transistors and small signal system circuits together on the same single chip substrate.

According to an aspect of the invention, an semiconductor integrated circuit device for a motor driving circuit which has power transistors and small signal system circuits together on the same single chip substrate comprises: an N-type epitaxial layer of an island portion is provided between N-type epitaxial layers of the power transistor portions and epitaxial layers of the small signal system circuit portions, wherein said N-type epitaxial layer of the island portion is connected to a ground.

According to another aspect of the invention, N-type epitaxial layer of the island portion surrounds three sides of N-type epitaxial layers of the power transistor portions except for a chip end side of the power transistor portions.

According to further aspect of the invention, a semiconductor integrated circuit device for a motor driving circuit which has power transistors on ground and power supply source sides and small signal system circuits together on the same single chip substrate comprises: an N-type epitaxial layer of an island portion is provided between N-type epitaxial layers of the power transistors on the ground side and N-type epitaxial layers of the power transistors on the power supply source side, wherein said N-type epitaxial layer of the island portion is connected to a ground.

According to further aspect of the invention, N-type epitaxial layer of the island portion surrounds three sides of N-type epitaxial layers of the power transistor portions on the ground side except for a chip end side of the power transistor portions on the ground side.

DETAILED DESCRIPTION OF PREFERRED EMBODIMENTS

Embodiment 1

Figure 1:
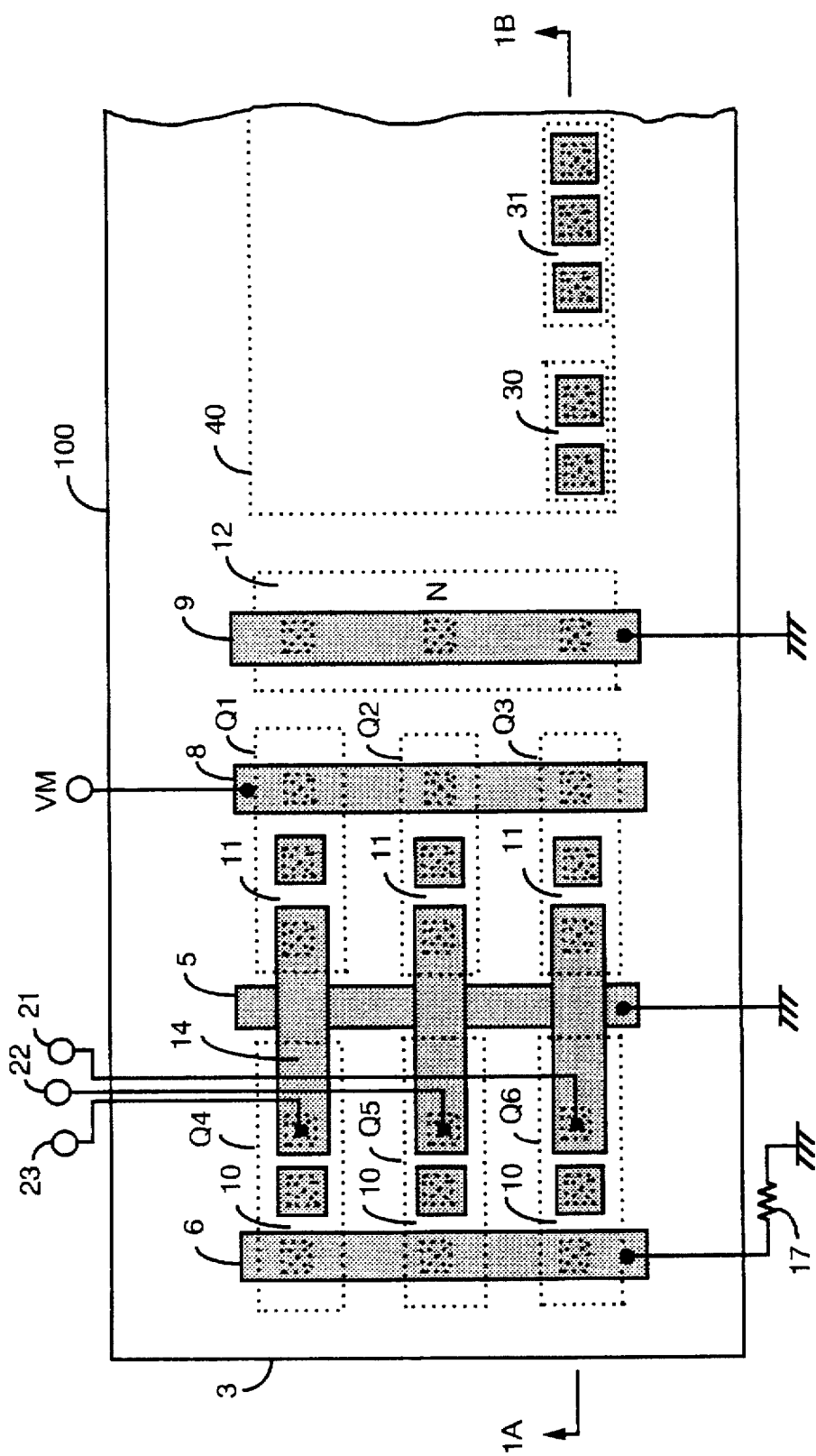
FIG. 1 is an view of a semiconductor device of a first embodiment of the present invention.
Figure 2:
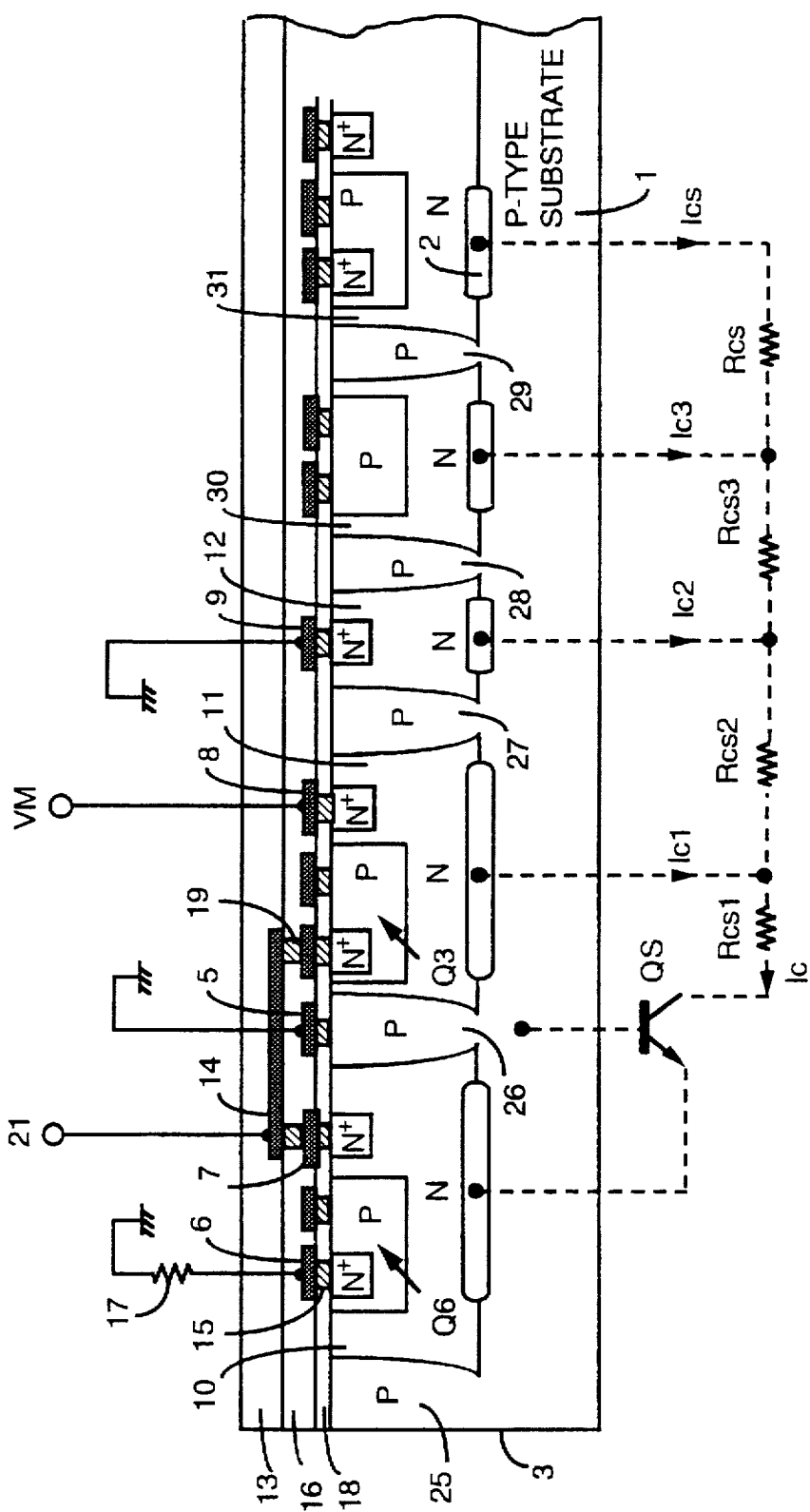
FIG. 2 is a cross-sectional view of the semiconductor device of the first embodiment of the present invention as seen along the line 2—2 of FIG. 1.

FIG. 1 is a plan view of a semiconductor device for a motor driving circuit of a first embodiment of the present invention. FIG. 2 is a cross-sectional view of the semiconductor integrated circuit device taken along a line 2—2 of FIG. 1. In FIG. 1, the semiconductor device comprises a motor driving circuit 100, power transistors Q1–Q3 on a power supply source side, power transistors Q4–Q6 on the ground side, a chip end 3 of a substrate, alminum wiring-boards 5, 6, 8, 9, 14 for wiring, epitaxial layers 10 of the power transistors on the ground side, epitaxial layers 11 of the power transistors on the power source side, an epitaxial layer 12 of an N-type island, a resistor 17, a small signal circuit portion 40, an epitaxial layer 30 of resistors in the small signal circuit portion 40, an epitaxial layer 31 of transistors in the small signal circuit portion 40. The resistive portion 30 and the transistor portion 31 are shown as a few examples among various circuits in the small signal circuit portion 40.

In FIG. 1, collector electrodes in the epitaxial layers 11 of the power transistors on the power supply source side are connected to a motor driving power supply source terminal VM. Emitter electrodes in the epitaxial layer 10 of the power transistors on the ground side are connected to the ground via the alminum wiring-board 6 and the resistor 17. Emitter electrodes in the epitaxial layers 11 of the power transistors on the power supply source side are connected to corresponding collector electrodes in the epitaxial layer 10 of the power transistors on the ground side at respective phases. Furthermore, the emitter electrodes in the epitaxial layers 11 and collector electrodes in the epitaxial layer 10 are commonly connected to corresponding terminals 21, 22, 23 of the motor driving circuit 100.

FIG. 2 is the cross-sectional view of the semiconductor integrated circuit device taken along the line 2—2 of FIG. 1. In FIG. 2, the semiconductor integrated circuit device comprises a P-type substrate 1, an embedded layer 2, the chip end 3 of the substrate, separating layers 25, 26, 27, 28, 29, the alminum wiring-boards 5–9 for wiring, the epitaxial layer 10 of the power transistor on the ground side, the epitaxial layer 11 of the power transistor on the power supply source side, the epitaxial layer 12 of the N-type island, a glass coating layer 13, the alminum wiring-board 14, a penetrating layer 15, an inter-layer film 16, a penetrating layer 19, an insulating layer 18, a parasitic transistor QS, parasitic resistances Rcs1–Rcs3, Rcs, the parasitic currents $I_{C1}$–$I_{C3}$, $I_{CS}$ are supplied from respective epitaxial layer 11, the epitaxial layer 12 and the epitaxial layer 30 to the collector of the parasitic transistor QS. A separating layer 26 between the epitaxial layer 10 of the power transistor on the ground side and the epitaxial layer 11 of the power transistor on the power supply source side is connected to the ground via the penetrating layer 15 penetrating through the insulating layer 18 and the alminum wiring-board 5. On the other hand, the epitaxial layer 12 of the N-type island is connected, in the same way, to the ground via the alminum wiring-board 9. The others in practice are the same as those explained in FIG. 11, therefore they are not explained here.

Figure 10:
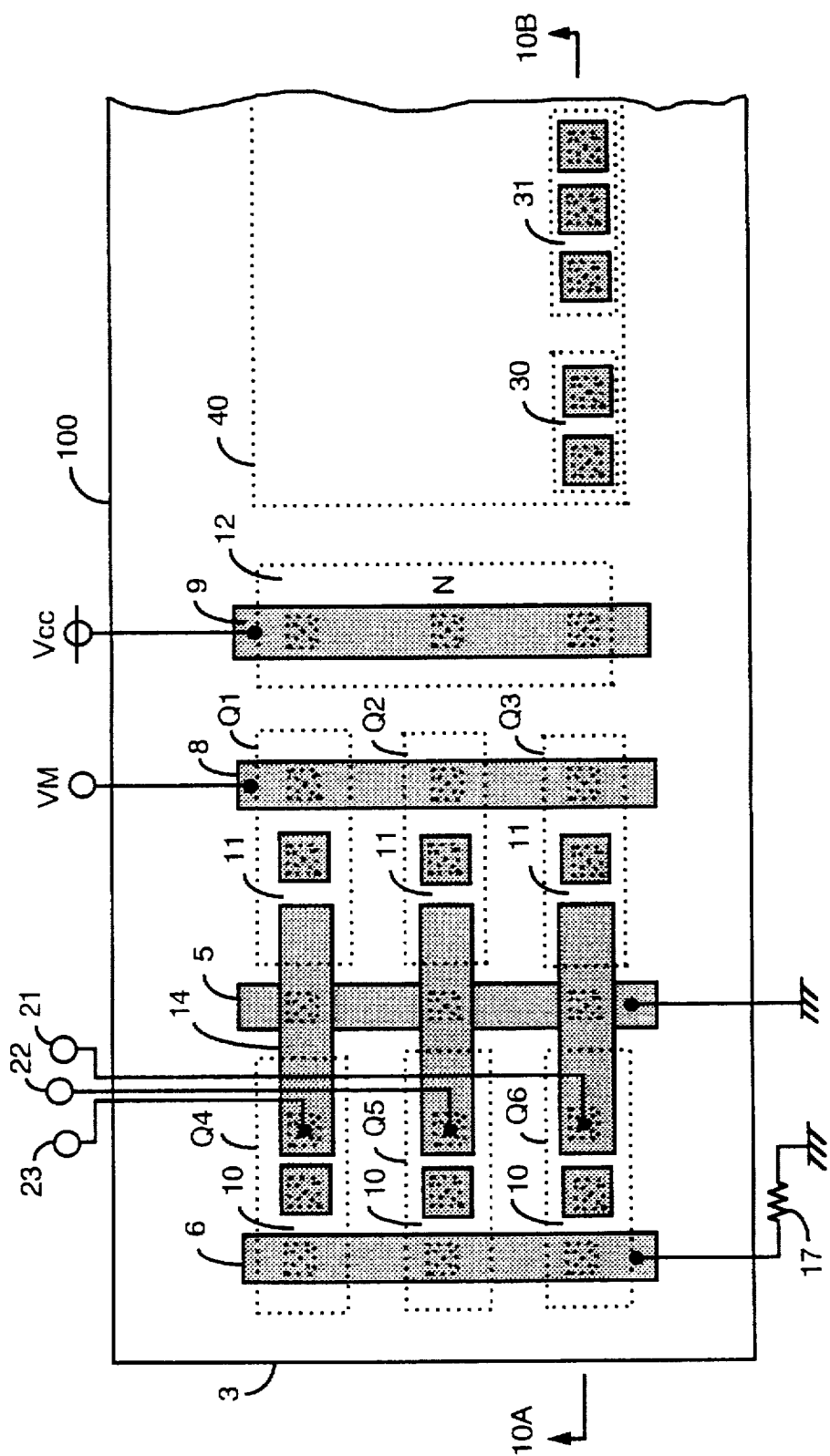
FIG. 10 shows an example of a plan view of a conventional semiconductor device for motor driving.
Figure 11:
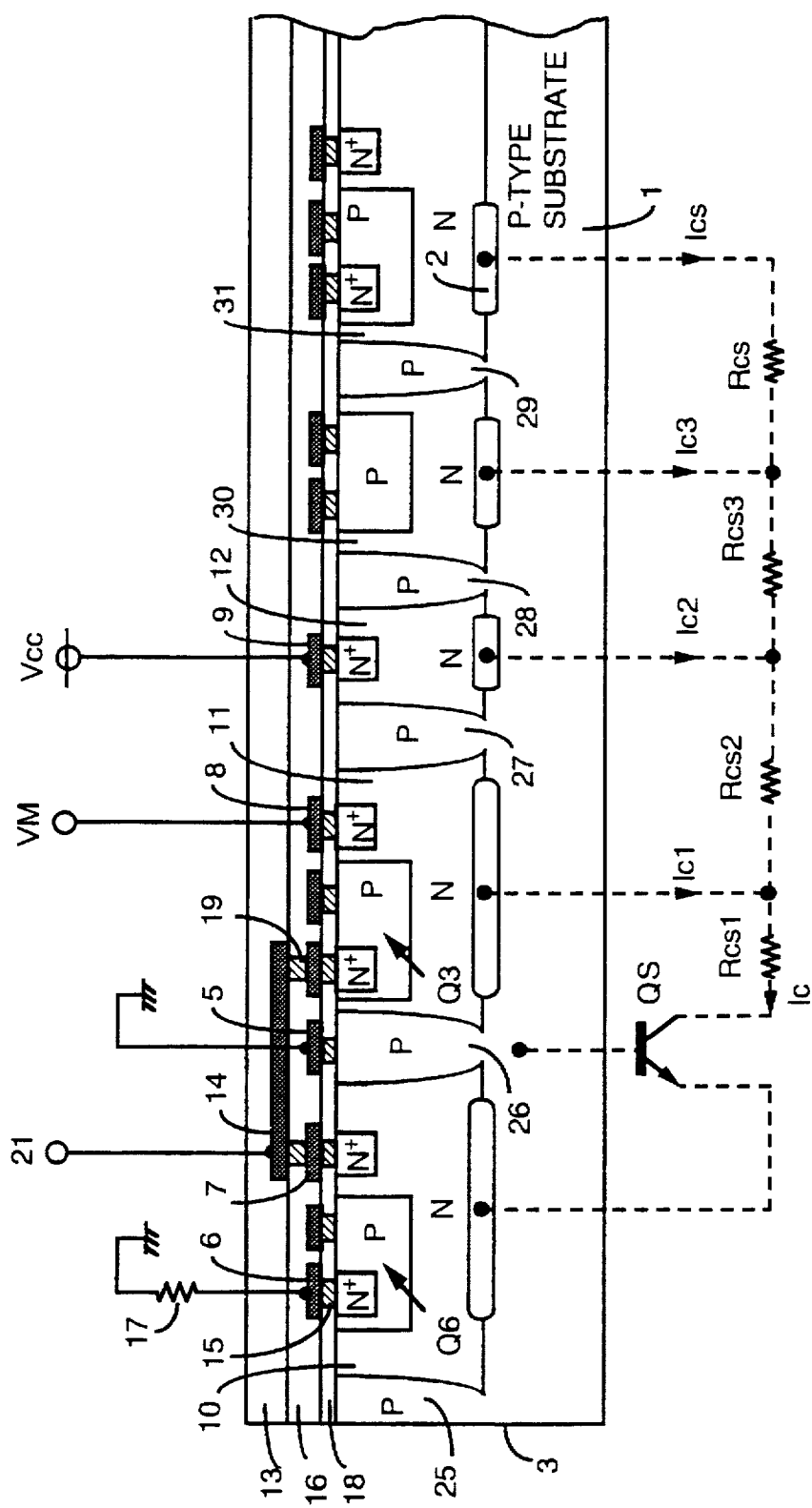
FIG. 11 shows an example of a cross-sectional view of a conventional semiconductor device for motor driving.
Figure 12:
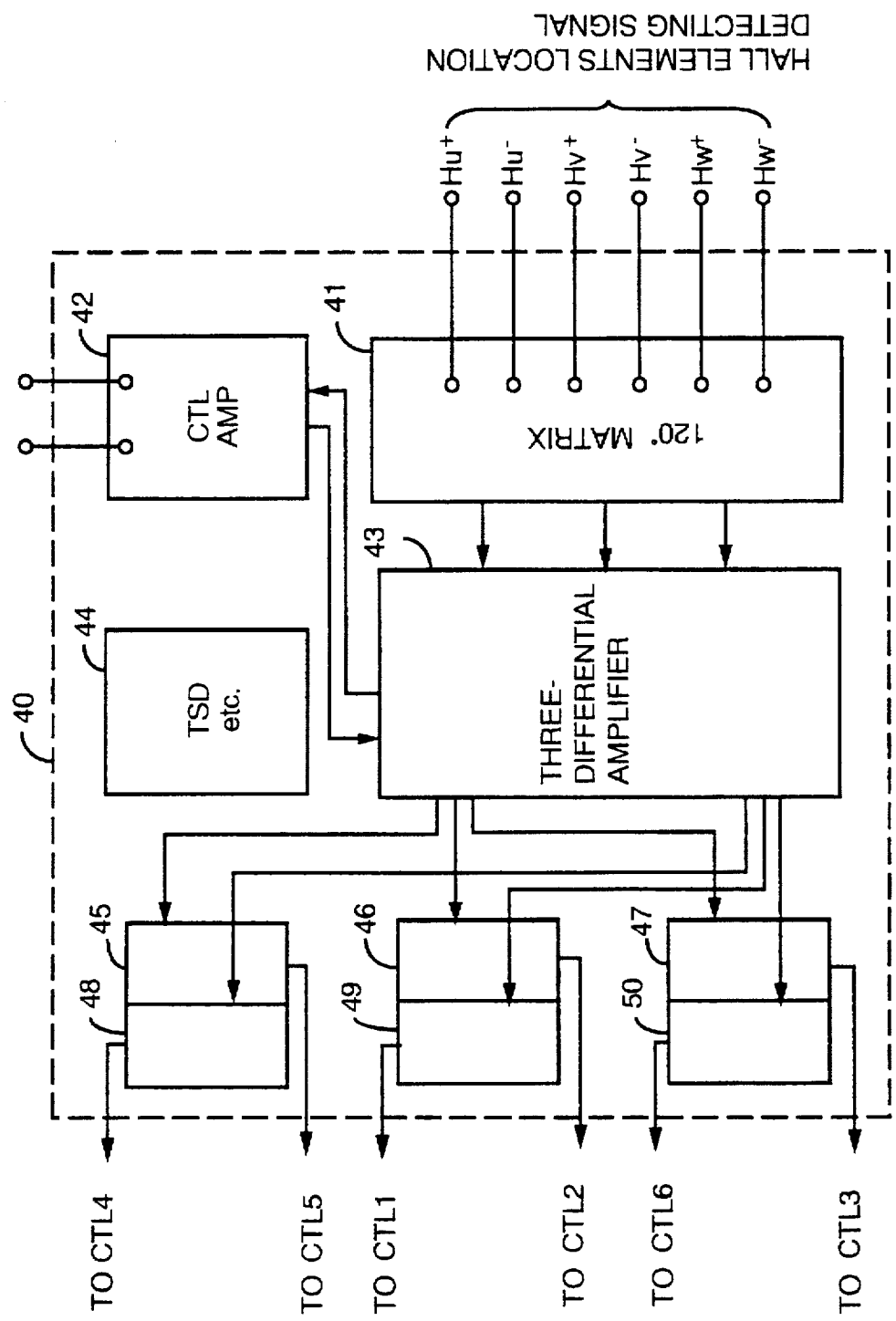
FIG. 12 shows an example of a small signal circuit used for a conventional semiconductor device for motor driving.

The semiconductor integrated circuit device shown in FIGS. 1, 2 is different from the prior art shown in FIGS. 10, 11 in that the epitaxial layer 12 of the N-type island provided between the power transistor portion and the small signal circuit portion 40 is connected to the ground via the penetrating layer 15 and the alminum wiring-board 9. A detailed explanation is provided below.

Since respective elements are connected as explained above, the separating area 26 connected to the ground functions as a base of the parasitic transistor QS. The epitaxial layer 10 of the transistor Q6 functions as an emitter. The epitaxial layer 11 of the transistor Q3, the epitaxial layer 12 of the N-type island, and the epitaxial layers 30, 31 of the small signal circuit portion and so on function as a collector for the parasitic transistor QS.

Figure 7:
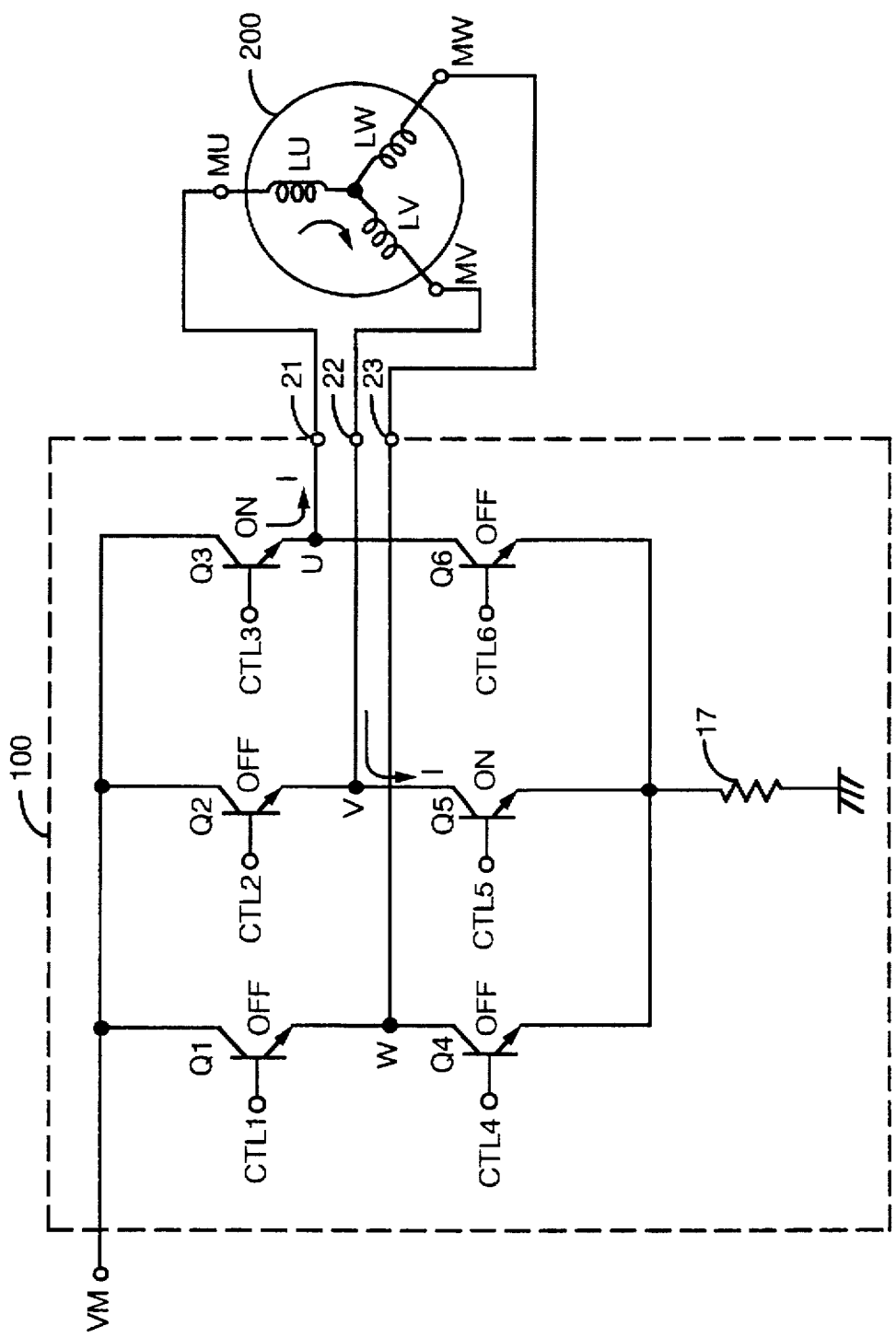
FIG. 7 shows a state of operation of a motor driving circuit.
Figure 8:
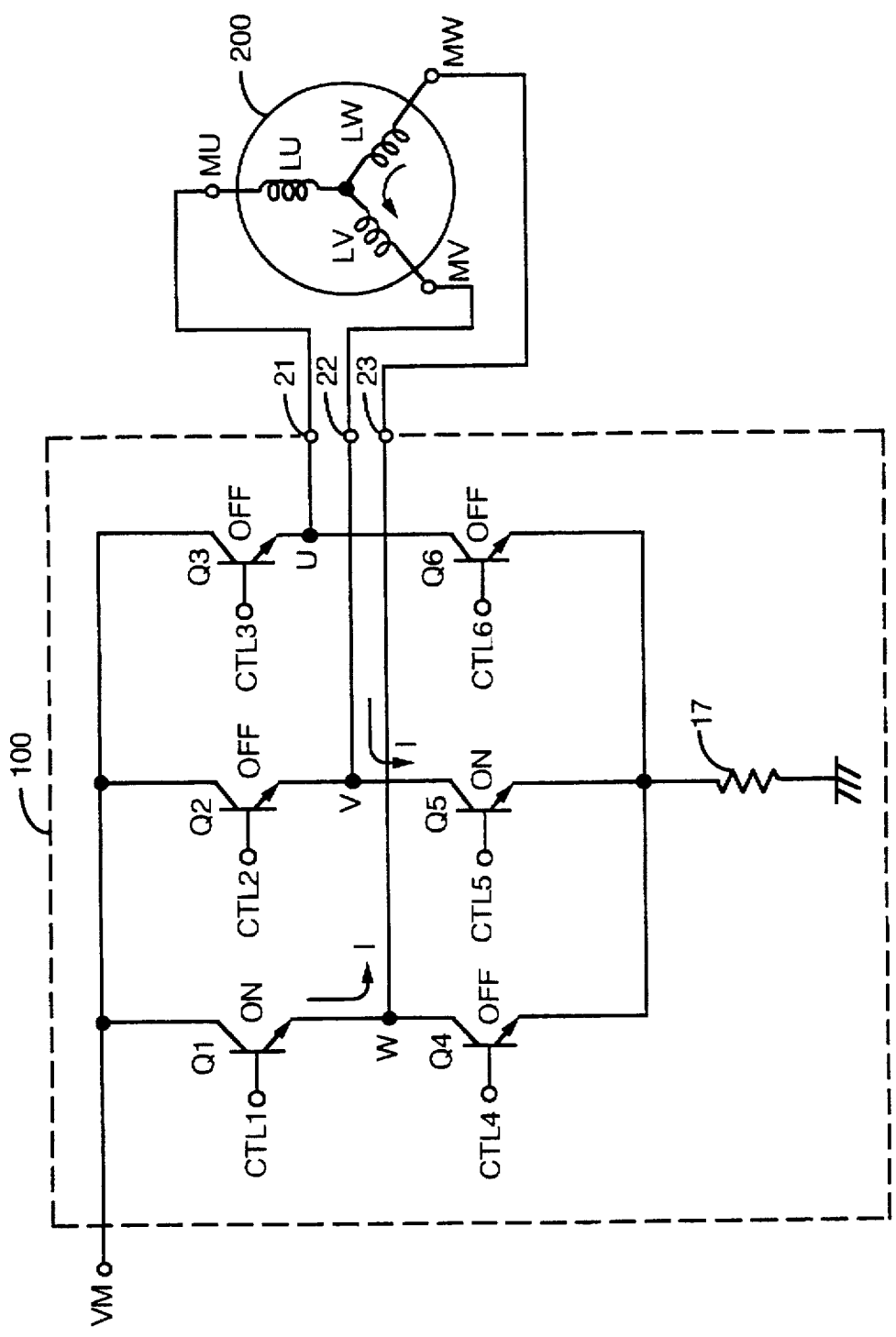
FIG. 8 shows another state of operation of a motor driving circuit.
Figure 9:
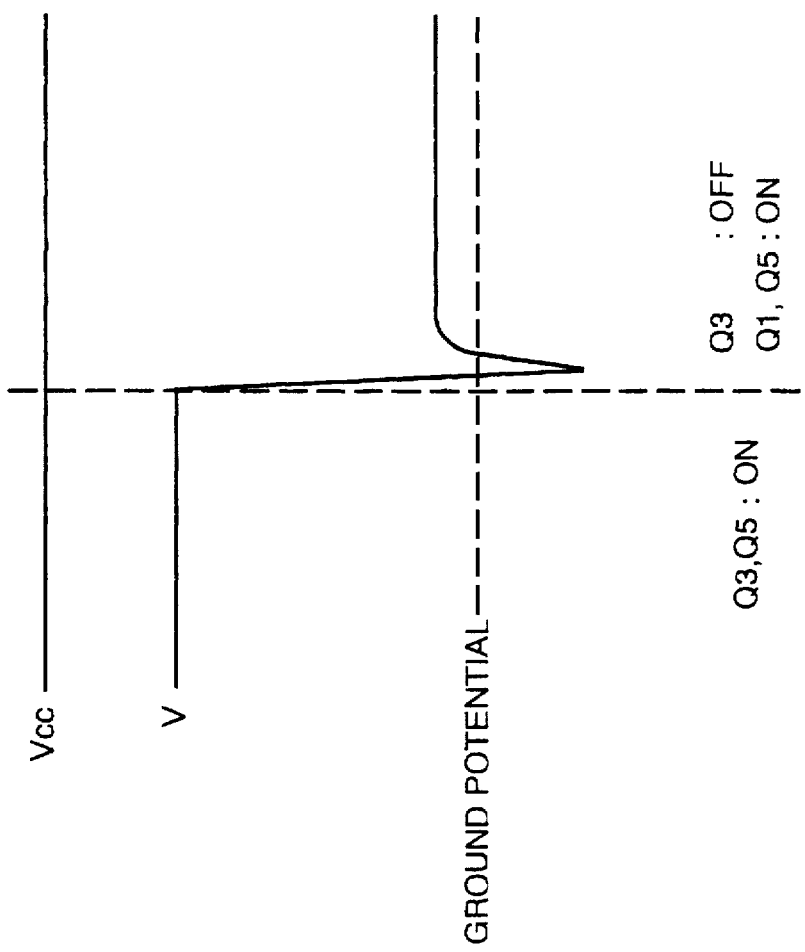
FIG. 9 shows an output voltage waveform of a motor driving circuit.

As shown in FIGS. 7, 8, when the motor driving 100 turns the power transistor Q3 off and the power transistor Q1 on, the current changes its direction and flows from the coil LW to the coil LV of the motor 200 and the current flowing through the coil LU stops suddenly. As a result, the collector potential of the transistor Q6 transiently turns from the positive voltage (+V) to a negative voltage as shown in FIG. 9.

At this time, as shown in FIG. 2, since the potential of the epitaxial layer 10 (on the emitter side of the NPN parasitic transistor QS) of the transistor Q6 connected to the terminal 21 becomes lower than that on the base side of the parasitic transistor QS, the NPN parasitic transistor QS turns on. In the first embodiment, the P-type substrate 1 is connected to the ground between the epitaxial layer 10 of the power transistors on the ground side and the epitaxial layers 11 of the power transistors on the power supply source side, and the collector current of the NPN parasitic transistor QS is mostly supplied by the epitaxial layers 11 of the power transistors on the power supply source side and the N-type epitaxial layer 12. As a result, the collector serial resistance Res between the NPN parasitic transistor QS and the small signal circuit portion 40 increases, and therefore the parasitic current $I_{CS}$ flowing through the small signal circuit portion 40 decreases, which prevents abnormal operations from occurring in the small signal circuit portion 40.

As explained above, the NPN parasitic transistor QS draws the current mostly from the epitaxial layers 11 of the power transistors on the power supply source side and the epitaxial layer 12 of the N-type island.

Furthermore, in the first embodiment, there is an advantage that the power consumption by the current $I_{C2}$ flowing through the epitaxial layer 12 of the N-type island decreases, since the alminum wiring-board 9 is connected to the ground and the voltage difference between the alminum wiring-board 9 and the emitter of the parasitic transistor QS is as small such as 1 volt [V]. In the prior art, the voltage difference between the alminum wiring-board 9 where the power supply source voltage is applied and the emitter of the parasitic transistor QS is more than several volts.

Calculating this power consumption on the assumption that the power supply source voltage is 12 V, PN junction voltage of the NPN parasitic transistor QS is 0.7 V, and the parasitic current $I_C$ is 0.1 A, for example, the power consumption in the prior art is obtained by multiplying the voltage by the current flowing through the PN junction of the NPN parasitic transistor QS, such as (12 V+0.7 V)×0.1 A=1.27 W.

In the first embodiment, however, the power consumption at the NPN parasitic transistor QS is calculated as a multi-collector transistor, where the power consumption is considered to be the sum of the power of the PN junction to which the power supply source voltage is applied and that of the PN junction to which the power supply source voltage is not applied. In the first embodiment, assuming that the current from the epitaxial layers 11 of the power transistors on the power supply source side is 70%, the current from the epitaxial layer of the N-type island is 30%, for example, the whole power consumption is obtained such as {(12 V+0.7 V)×0.1 A×0.7}+{0.7 V×0.1 A×0.3}=0.91 W, which is smaller than the power consumption in the prior art. This is significantly advantageous, when reverse rotation and braking of the motor occur frequently. Although the parasitic current Ic 13 flows between the power supply source and the output terminal in the prior art, it flows between the ground and the output terminal in the present embodiment. Therefore, the power consumption can be greatly reduced.

Embodiment 2

Figure 3:
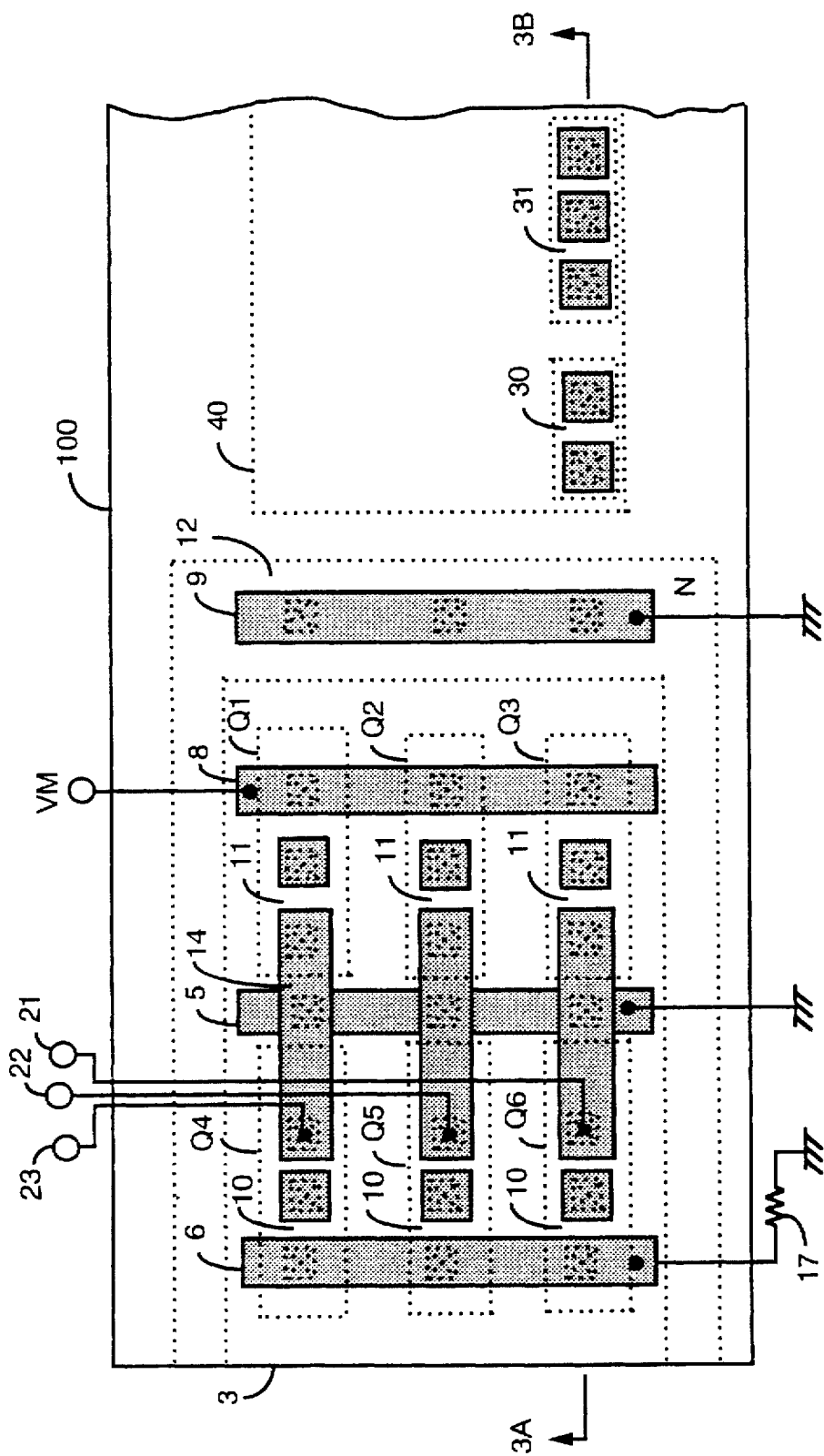
FIG. 3 is a plan view of a semiconductor device of a second embodiment of the present invention.

FIG. 3 is a plan view of a semiconductor device for a motor driving circuit of a second embodiment of the present invention. Elements commonly numbered in FIG. 1, FIG. 2 and FIG. 3 are not provided with a detailed explanation here, because those elements arc described above in connection with FIGS. 1, 2. The device in FIG. 3 is different from that in FIG. 1 in that an epitaxial layer 12 of an N-type island surrounds an epitaxial layer 10 of power transistors on the ground side and an epitaxial layers 11 of power transistors on the power supply source side.

In FIG. 3, collector electrodes in the epitaxial layers 11 of the power transistors on the power supply source side are commonly connected to a motor driving power supply source terminal VM. Emitter electrodes in the epitaxial layer 10 of the power transistors on the ground side are connected to the ground via an alminum wiring-board 6 and a resistor 17. Emitter electrodes in the epitaxial layers 11 of the power transistors on the power supply source side are connected to the collector electrodes in the epitaxial layers 10 of the power transistors on the ground side at respective phases, and also to the corresponding terminals 21, 22, 23 of the motor driving circuit 100. The epitaxial layer 12 of the N-type island are connected to the ground via an alminum wiring-board 9.

In the second embodiment, the only difference from the first embodiment is that the epitaxial layer 12 of the N-type island surrounds the epitaxial layers 10 of the power transistors on the ground side and the epitaxial layers 11 of the power transistors on the power supply source side. This surrounding allows an NPN parasitic transistor to draw more current from the epitaxial layer 12 of the N-type island. As a result, a collector serial resistance Rcs between the NPN parasitic transistor QS and a small signal circuit portion 40 increases, therefore parasitic current $I_{CS}$ flowing through the small signal circuit portion 40 decreases which prevents abnormal operations from occurring in the small signal circuit portion 40.

Furthermore, in the second embodiment, there is an advantage that a voltage difference between the alminum wiring-board 9 of the epitaxial layer 12 of the N-type island and an emitter of the parasitic transistor QS is as small as 1 volt, and a power consumption by a current $I_{C2}$ flowing through the epitaxial layer 12 of the N-type island decreases, since the alminum wiring-board 9 of the epitaxial layer 12 of the N-type island is connected to the ground. While in the prior art, the voltage difference between the alminum wiring-board 9 of the epitaxial layer 12 of the N-type island where the power supply source voltage is applied and the emitter of the parasitic transistor QS is more than several volts.

The power consumption is calculated as follows. A power consumption at the NPN parasitic transistor QS of the second embodiment can be calculated as a multi-collector in the same way as that of the first embodiment. It is also possible to consider that the power consumption at the NPN parasitic transistor QS is the sum of a power of a PN junction to which the power supply source voltage is applied and a power of a PN junction to which the power supply source voltage is not applied. In the second embodiment, more current can be drawn from the epitaxial layer 12 of the N-type island. Assuming that the current from the epitaxial layers 11 of the power transistors on the power supply source side is 60%, the current from the epitaxial layer of the N-type island is 40%, for example, the whole power consumption is obtained such as {(12 V+0.7 V)×0.1 A×0.6}+{0.7 V×0.1 A×0.4}=0.8 W, which is smaller than that in the prior art.

Embodiment 3

Figure 4:
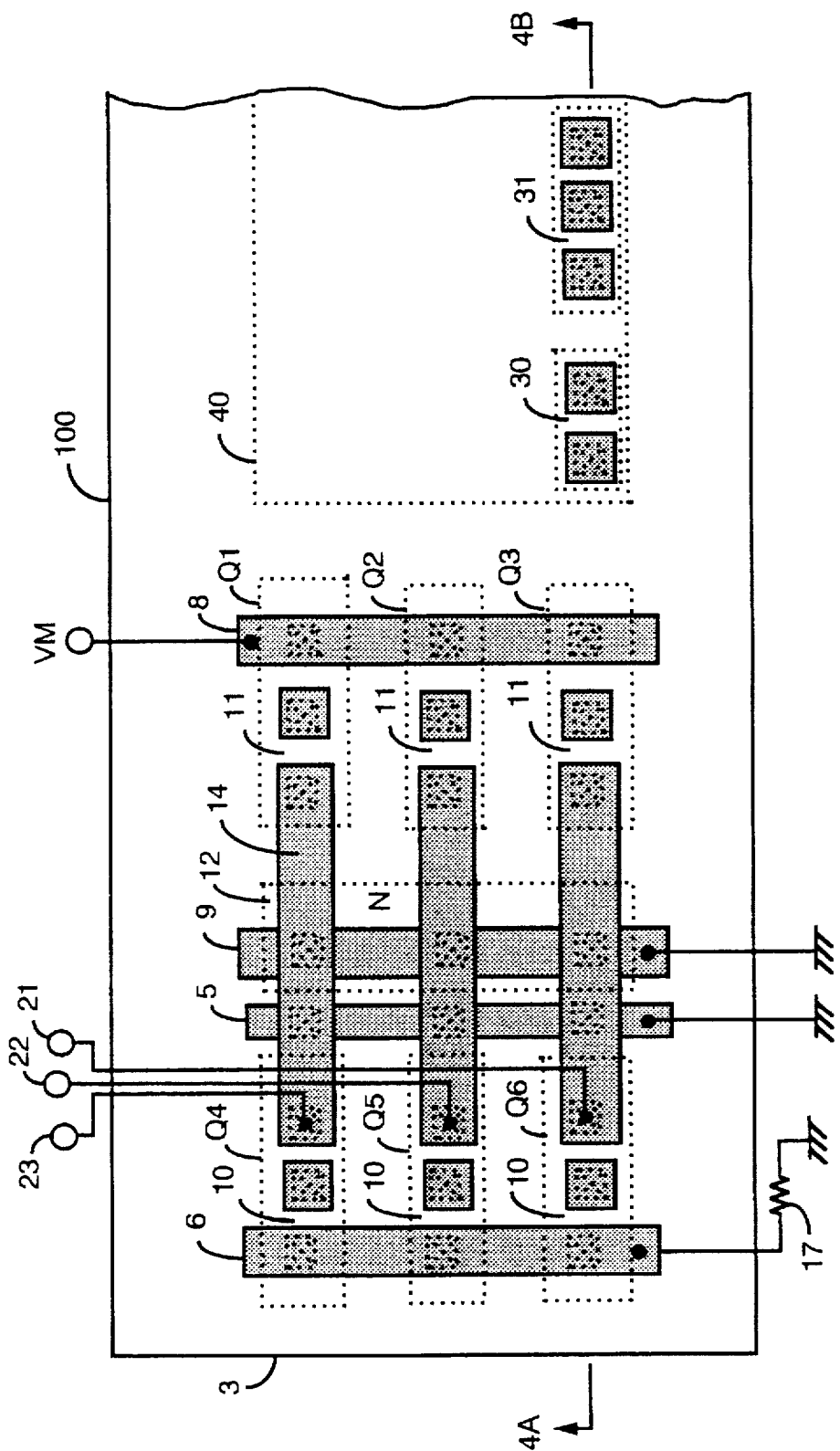
FIG. 4 is a plan view of a semiconductor device of a third embodiment of the present invention.
Figure 5:
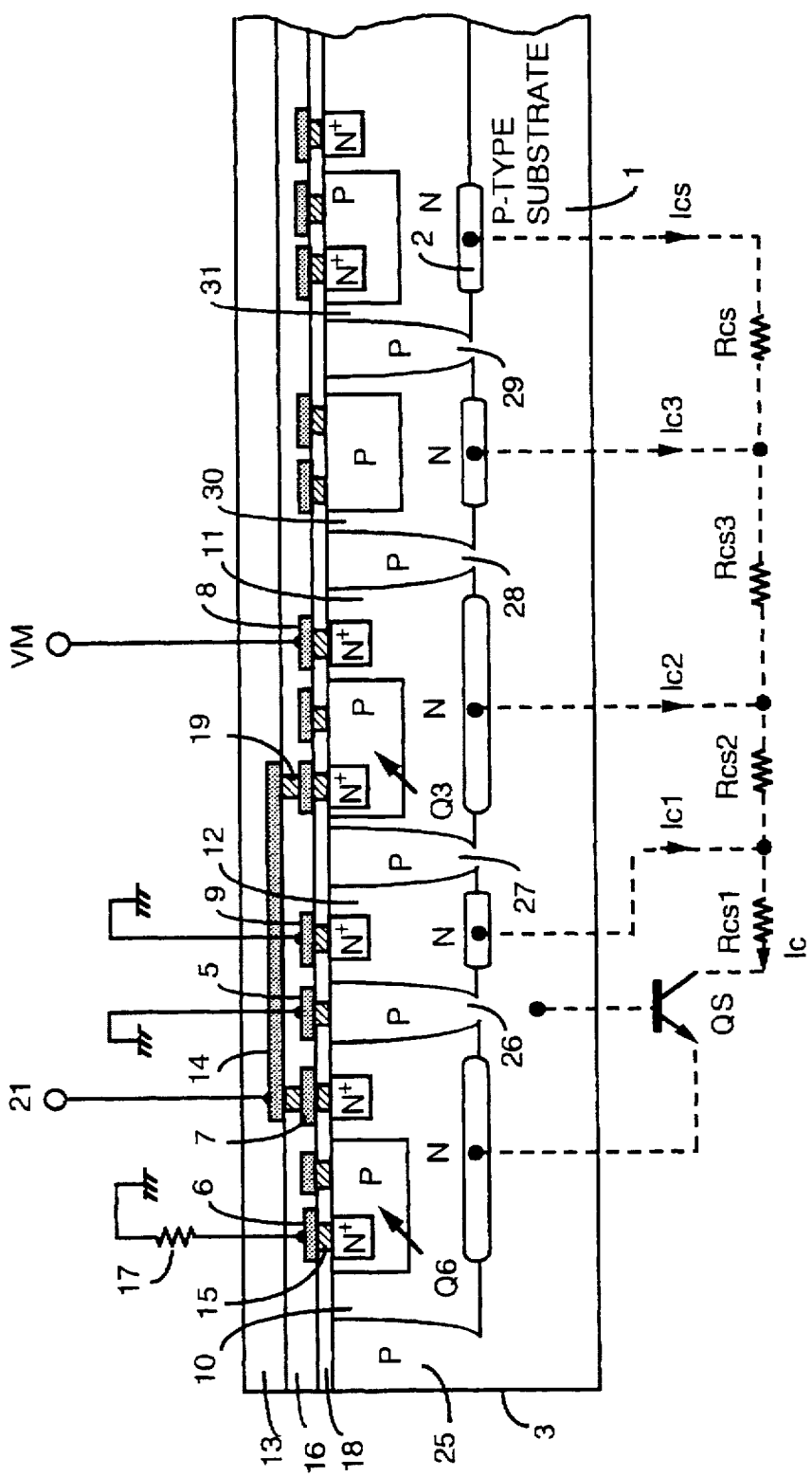
FIG. 5 is a cross-sectional view of the semiconductor device of the third embodiment of the present invention as seen along the line 5—5 of FIG. 4.

FIG. 4 is a plan view of a semiconductor device for a motor driving circuit of a third embodiment of the present invention. FIG. 5 is a cross-sectional view of a semiconductor integrated circuit device taken along a line 5—5 in FIG. 4. Elements commonly numbered in FIGS. 1, 2 and FIGS. 4, 5 are not provided with a detailed explanation here, because those elements are described above in connection with FIGS. 1, 2.

In FIG. 4, collector electrodes in an epitaxial layers 11 of power transistors on power supply side are commonly connected to a motor driving power supply source terminal VM. Emitter electrodes in epitaxial layers 10 of power transistors on the ground side are connected to the ground via an alminum wiring-board 6 and a resistor 17. Emitter electrodes in the epitaxial layers 11 of the power transistors on the power supply source side are connected to collector electrodes in the epitaxial layers 10 of power transistors on the ground side at respective phases, and to the corresponding terminals 21, 22, 23 of a motor driving circuit 100.

A separating area 26 of respective phases is connected to the ground via an alminum wiring-board 5. On the other hand, an epitaxial layer 12 of an N-type island is connected to the ground via the penetrating layer 15 and an alminum wiring-board 9.

The device in FIGS. 4, 5 is different from that in FIGS. 10, 11 of the prior art in that the epitaxial layer of the N-type island is inserted between the epitaxial layers 10 of the power transistors on the ground side and the epitaxial layers 11 of the power transistors on the power supply source side and is connected to the ground. A detailed explanation is provided below.

Since respective elements are connected as explained above, the separating area 26 which is connected to the ground functions as a base, the epitaxial layer 10 of a transistor Q6 functions as an emitter, and the epitaxial layer 12 of the N-type island, the epitaxial layer 11 of transistors Q3 and epitaxial layers 30, 31 of a small signal circuit portion function as a collector of a parasitic transistor QS. As shown in FIGS. 7, 8, when the motor driving 100 turns the power transistor Q3 off and the power transistor Q1 on, the current changes its direction and flows from the coil LW to the coil LV of the motor 200 and the current flowing through the coil LU stops suddenly. As a result, the collector potential of the transistor Q6 transiently turns from the positive voltage (+V) to a negative voltage as shown in FIG. 9.

At this time, the NPN parasitic transistor QS turns on since a potential of the epitaxial layer 10 of the transistor Q6 which is connected to the terminal 21 (the emitter side of the NPN parasitic transistor QS) is lower than that on the base side of the parasitic transistor QS, as shown in FIG. 5. In the third embodiment, the collector of the parasitic transistor QS is connected to the ground via the epitaxial layer 12 of the N-type island. The most collector current for the NPN parasitic transistor QS is provided by the epitaxial layer 12 of the N-type island and the epitaxial layers 11 of the power transistors on the power supply source side, which allow a collector serial resistive component Rcs between the NPN parasitic transistor QS and the small signal circuit portion 40 to increase. Therefore, a parasitic current $I_{CS}$ flowing through the small signal circuit portion 40 decreases which prevents abnormal operations from occurring in the small signal circuit portion 40.

Furthermore, in the third embodiment, there is an advantage that a voltage difference between the alminum wiring-board 9 of the epitaxial layer 12 of the N-type island and an emitter of the parasitic transistor QS is as small as 1 volt, and a power consumption by a current $I_{C2}$ flowing the epitaxial layer 12 of the N-type island decreases, since the alminum wiring-board 9 of the epitaxial layer 12 of the N-type island is connected to the ground. While in the prior art, the voltage difference between the alminum wiring-board 9 of the epitaxial layer 12 of the N-type island where the power supply source voltage is applied and the emitter of the parasitic transistor QS is more than several volts. The power consumption decreases more than that in the first and the second embodiments, since more collector current is provided by the epitaxial layer 12 of the N-type island.

The power consumption is concretely calculated as follows. A power at the NPN parasitic transistor QS of the third embodiment can be calculated as a multi-collector in the same way as that of the first embodiment. It is also possible to consider that the power consumption at the NPN parasitic transistor QS is the sum of a power of a PN junction to which the power supply source voltage is applied and a power of a PN junction to which the power supply source voltage is not applied. In the third embodiment, more current is provided to the collector of the NPN parasitic transistor QS by the epitaxial layer 12 of the N-type island than the epitaxial layers 11 of the power transistors on the power supply source side, since the epitaxial layer 12 of the N-type island is closer to the NPN parasitic transistor QS than the epitaxial layers 11 of the power transistors on the power supply source side. If assuming that the current from the epitaxial layers 11 of the power transistors on the power supply source side is 40%, the current from the epitaxial layer of the N-type island is 60%, for example, the whole power consumption is obtained such as {(12 V+0.7 V)×0.1 A×0.4}+{0.7 V 0.1 A×0.6}=0.55 W, which is smaller than that in the prior art.

Embodiment 4

Figure 6:
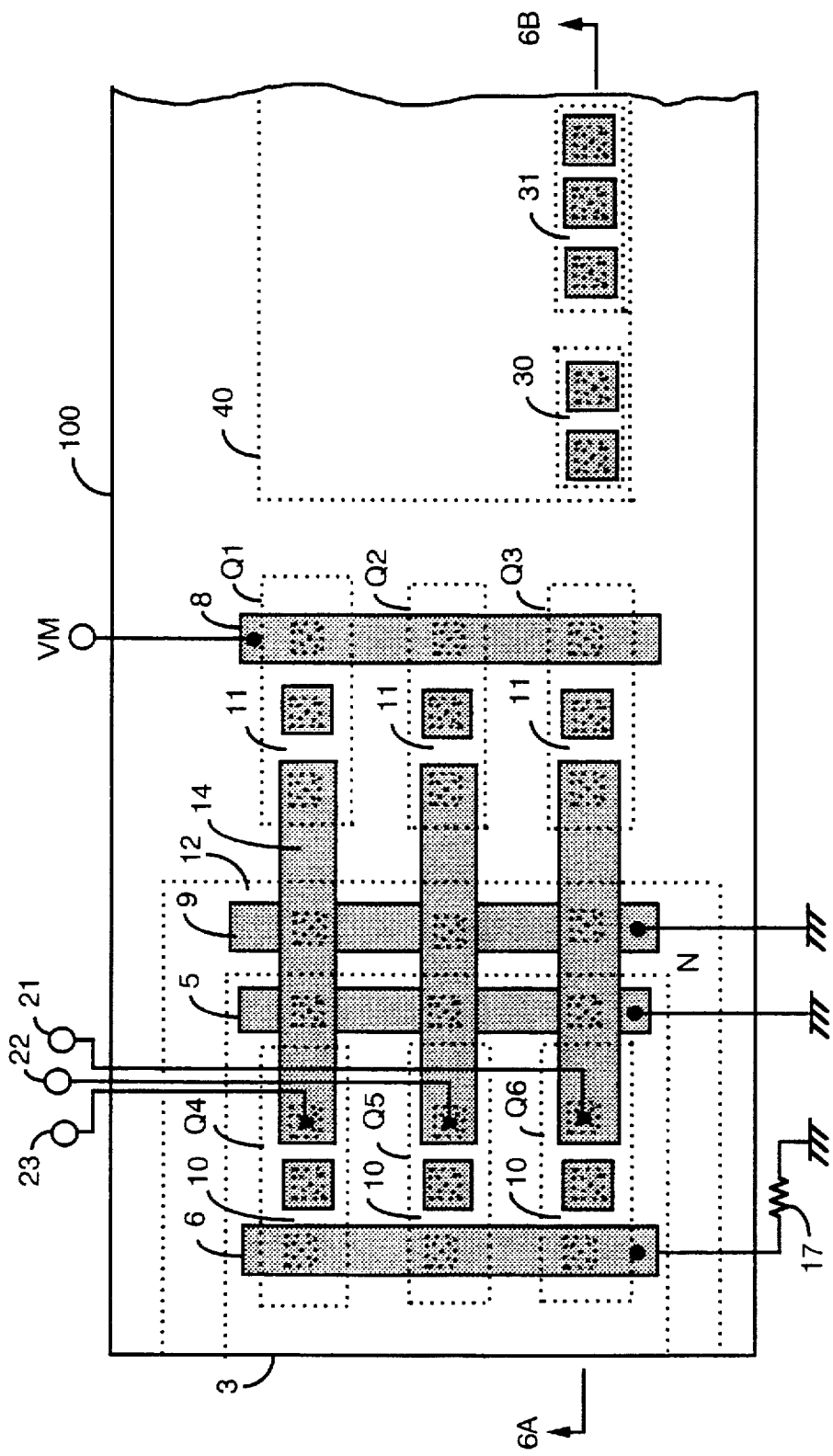
FIG. 6 is a plan view of a semiconductor device of a fourth embodiment of the present invention.

FIG. 6 is a plan view of a semiconductor device for a motor driving circuit of a fourth embodiment of the present invention. Elements commonly numbered in FIG. 1 and FIG. 6 are not provided with a detailed explanation here, because those elements are described above in connection with FIG. 1.

In FIG. 6, collector electrodes in an epitaxial layers 11 of power transistors on power supply source side are commonly connected to a motor driving power supply source terminal VM. Emitter electrodes in an epitaxial layers 10 of power transistors on the ground side are connected to the ground via an alminum wiring-board 6 and a resistor 17. Emitter electrodes in the epitaxial layers 11 of the power transistors on the power supply source side are connected to collector electrodes in the epitaxial layers 10 of power transistors on the ground side at respective phases, and to the corresponding terminals 21, 22, 23 of a motor driving circuit 100.

A separating area 26 of respective phases is connected to the ground via an alminum wiring-board 5. On the other hand, an epitaxial layer 12 of an N-type island is connected to the ground via the penetrating layer 15 and an alminum wiring-board 9.

In the fourth embodiment, it is the only difference from the third embodiment in that the epitaxial layer 12 of the N-type island surrounds the epitaxial layers 10 of the power transistors on the ground side. This surrounding allows an NPN parasitic transistor to draw more current from the epitaxial layer 12 of the N-type island. As a result, a collector serial resistance Rcs between the NPN parasitic transistor QS and a small signal circuit portion 40 increases, therefore parasitic current $I_{CS}$ flowing through the small signal circuit portion 40 further decreases, which prevents abnormal operations occurred in the small signal circuit portion 40.

Furthermore, in the fourth embodiment, there is an advantage that a voltage difference between the alminum wiring-board 9 of the epitaxial layer 12 of the N-type island and an emitter of the parasitic transistor QS is as small as 1 volt, and a power consumption by a current $I_{C2}$ flowing the epitaxial layer 12 of the N-type island decreases, since the alminum wiring-board 9 of the epitaxial layer 12 of the N-type island is connected to the ground. While in the prior art, the voltage difference between the alminum wiring-board 9 of the epitaxial layer 12 of the N-type island where the power supply source voltage is applied and the emitter of the parasitic transistor QS is more than several volts. The power consumption in the fourth embodiment decreases more than that in the embodiments 1-3, since more collector current is provided by the epitaxial layer 12 of the N-type island than in the embodiments 1-3.

The power consumption is calculated as follows. A power at the NPN parasitic transistor QS of the fourth embodiment can be calculated as a multi-collector in the same way as that of the first embodiment. It is also possible to consider that the power consumption at the NPN parasitic transistor QS is the sum of a power of a PN junction to which the power supply source voltage is applied and a power of a PN junction to which the power supply source voltage is not applied. In the fourth embodiment, more current is provided to the NPN parasitic transistor QS by the epitaxial layer 12 of the N-type island, since the epitaxial layer 12 of the N-type island is closer than the epitaxial layers 11 of the power transistors on the power supply source side to the NPN parasitic transistor QS, and further the epitaxial layer 12 of the N-type island surrounds the epitaxial layers 10 of the power transistors on the ground side. If assuming that the current from the epitaxial layers 11 of the power transistors on the power supply source side is 30%, the current from the epitaxial layer of the N-type island is 70%, for example, the whole power consumption is obtained such as {(12 V+0.7 V)×0.1 A×0.3}+{0.7 V×0.1 A×0.7}=0.43 W, which is further smaller than that in the prior art.

What is claimed is:

1. A semiconductor integrated circuit device for driving a motor, the device comprising:

a p-type semiconductor substrate having spaced apart first and second areas, each area including an n-type epitaxial layer;

power transistors in the epitaxial layer within the first area;

a small signal system circuit, including at least one transistor, in the epitaxial layer within the second area; and an n-type guard region in the epitaxial layer spaced apart from the first and second areas and disposed at least partially between the first and second areas, the n-type guard region being connected to a ground potential node.

2. The semiconductor integrated circuit device according to claim 1 wherein the n-type guard region extends along three sides of the first area.

3. A semiconductor integrated circuit device for driving a motor, the device comprising:

a p-type semiconductor substrate having spaced apart first, second, and third areas, each area including an n-type epitaxial layer;

power transistors on a ground side in the epitaxial layer within the first area;

power transistors on a power supply side in the epitaxial layer within the second area;

a small signal system circuit in the epitaxial layer within the third area; and an n-type guard region in the epitaxial layer spaced apart from the first and second areas and disposed at least partially between the first and second areas, the n-type guard region being connected to a ground potential node.

4. The semiconductor integrated circuit device according to claim 3 wherein the n-type guard region extends along three sides of the first area.

5. A semiconductor integrated circuit device for driving a motor, the device comprising:

a p-type semiconductor substrate and an n-type epitaxial layer disposed on the semiconductor substrate and having first and second areas arranged along a first direction;

a power transistor group located in the first area; and a small signal system circuit located in the second area and including at least one transistor, an n-type region of the epitaxial layer located between the first and second areas and surrounded by a p-type separating region extending through the epitaxial layer to the semiconductor substrate, the n-type region being electrically connected to a ground potential node.

6. The semiconductor integrated circuit device according to claim 5 wherein the region extends along sides of the first area in a U-shape.

7. The semiconductor integrated circuit device according to claim 5 wherein:

the power transistor group comprises a power supply side power transistor and a ground side power transistor, the ground side power transistor including a collector region connected to a first output node, an emitter region connected to the ground potential node, and a base region receiving control signals from the small system signal circuit; and the power supply side power transistor includes a collector region connected to a power supply source node, an emitter region connected to a second output node, and a base region receiving a control signal from the small signal system circuit, wherein the power supply side power transistor and the ground side power transistor are located along the first direction and the power supply side power transistor is located closer to the small signal system circuit than is the ground side power transistor.

8. The semiconductor integrated circuit device according to claim 7 wherein the ground side power transistor is located proximate an end of the semiconductor substrate.

9. The semiconductor integrated circuit device according to claim 7 wherein:

the power supply side power transistor is located in a region of the epitaxial layer surrounded by the p-type separating region extending through the epitaxial layer to the semiconductor substrate;

the ground side power transistor is located in a region of the epitaxial layer surrounded by the p-type separating region extending through the epitaxial layer to the semiconductor substrate; and the p-type separating region between the power supply side power transistor and the ground side power transistor is electrically connected to the ground potential node.

10. The semiconductor integrated circuit device according to claim 7 wherein:

the power supply side power transistor is located in a region of the epitaxial layer surrounded by the p-type separating region extending through the epitaxial layer to the semiconductor substrate;

the ground side power transistor is located in a region of the epitaxial layer surrounded by the p-type separating region extending through the epitaxial layer to the semiconductor substrate; and the p-type separating region surrounding the ground side power transistor is electrically connected to the ground potential node.

11. The semiconductor integrated circuit device according to claim 5 wherein:

the power transistor group comprises power supply side power transistors and ground side power transistors arranged along the first direction, the power supply power transistors being located closer to the small signal system circuit than are the ground side power transistors, the group of power supply power transistors including:

a U-phase power supply side power transistor having a collector region connected to a power supply source node, an emitter region connected to a U-phase output node connected to a U-phase terminal of a motor, and a base region connected to a U-phase power supply side power transistor receiving a control signal from the small signal system circuit;

a V-phase power supply side power transistor having a collector region connected to a power supply source node, an emitter region connected to a V-phase output node connected to a V-phase terminal of the motor, and a base region connected to a V-phase power supply side power transistor receiving a control signal from the small signal system circuit;

a W-phase power supply side power transistor having a collector region connected to a power supply source node, an emitter region connected to a W-phase output node connected to a W-phase terminal of the motor, and a base region connected to a W-phase power supply side power transistor receiving a control signal from the small signal system circuit, wherein the U-phase, V-phase, and W-phase power supply side power transistors are arranged along a second direction orthogonal to the first direction;

the group of ground side power transistors including:

a U-phase ground side power transistor having a collector region connected to the U-phase output node, an emitter region connected to the ground potential node, and a base region receiving a control signal from the small signal system circuit;

a V-phase ground side power transistor having a collector region connected to the V-phase output node, an emitter region connected to the ground potential node, and a base region receiving a control signal from the small signal system circuit;

a W-phase ground side power transistor having a collector region connected to the W-phase output node, an emitter region connected to the ground potential node, and a base region receiving a control signal from the small signal system circuit, the U-phase, V-phase, and W-phase ground side power transistors being arranged along the second direction.

12. The semiconductor integrated circuit device according to claim 11 wherein the ground side power transistors are located proximate an end of the semiconductor substrate.

13. The semiconductor integrated circuit device according to claim 11 wherein:

each power supply side power transistor is located in a region of the epitaxial layer surrounded by the p-type separating region extending through the epitaxial layer to the semiconductor substrate;

each ground side power transistor is located in a region of the epitaxial layer surrounded by the p-type separating region extending through the epitaxial layer to the semiconductor substrate; and respective p-type separating regions between respective power supply side power transistors and ground side power transistors are electrically connected to the ground potential node.

14. The semiconductor integrated circuit device according to claim 11 wherein:

each power supply side power transistor is located in a region of the epitaxial layer surrounded by the p-type separating region extending through the epitaxial layer to the semiconductor substrate;

each ground side power transistor is located in a region of the epitaxial layer surrounded by the p-type separating region extending through the epitaxial layer to the semiconductor substrate; and the p-type separating region surrounding the ground side power transistors is electrically connected to the ground potential node.

15. A semiconductor integrated circuit device for driving a motor, the device comprising:

a p-type semiconductor substrate and an n-type epitaxial layer disposed on the semiconductor substrate and having first and second areas arranged along a first direction;

a power transistor group located in the first area;

a small signal system circuit located in the second area and including at least one transistor, wherein the power transistor group comprises a power supply side power transistor and a ground side power transistor, the ground side power transistor including a collector region connected to a first output node, an emitter region connected to the ground potential node, and a base region receiving control signals from the small signal system signal circuit, and the power supply side power transistor includes a collector region connected to a power supply source node, an emitter region connected to a second output node, and a base region receiving a control signal from the small signal system circuit, wherein the power supply side power transistor and the ground side power transistor are located along the first direction; and an island comprising part of the epitaxial layer disposed between the power supply source side power transistor and the ground side power transistor and surrounded by the p-type separating region extending through the epitaxial layer to the semiconductor substrate and electrically connected to a ground potential node.

16. The semiconductor integrated circuit device according to claim 15 wherein the power supply side power transistor is located closer to the small signal system circuit than is the ground side power transistor.

17. The semiconductor integrated circuit device according to claim 16 wherein the island extends along sides of the ground side power transistor in a U-shape.

18. The semiconductor integrated circuit device according to claim 16 wherein the ground side power transistor is located proximate an end of the semiconductor substrate.

19. The semiconductor integrated circuit device according to claim 16 wherein:

the power supply side power transistor is located in a region of the epitaxial layer surrounded by the p-type separating region extending through the epitaxial layer to the semiconductor substrate;

the ground side power transistor is located in a region of the epitaxial layer surrounded by the p-type separating region extending through the epitaxial layer to the semiconductor substrate; and the p-type separating region between the power supply side power transistor and the ground side power transistor is electrically connected to the ground potential node.

20. A semiconductor integrated circuit device for driving a motor, the device comprising:

a p-type semiconductor substrate and an n-type epitaxial layer disposed on the semiconductor substrate and having first and second areas arranged along a first direction;

a small signal system circuit located in the second area and including at least one transistor;

a power transistor group located in the first area and including a group of power supply side power transistors and a group of ground side power transistors, the group of power supply side power transistors and the group of ground side power transistors being arranged along the first direction, the group of power supply power transistors including:
- a U-phase power supply side power transistor having a collector region connected to a power supply source node, an emitter region connected to a U-phase output node connected to a U-phase terminal of a motor, and a base region connected to a U-phase power supply side power transistor receiving a control signal from the small signal system circuit;
- a V-phase power supply side power transistor having a collector region connected to a power supply source node, an emitter region connected to a V-phase output node connected to a V-phase terminal of the motor, and a base region connected to a V-phase power supply side power transistor receiving a control signal from the small signal system circuit;
- a W-phase power supply side power transistor having a collector region connected to a power supply source node, an emitter region connected to a W-phase output node connected to a W-phase terminal of the motor, and a base region connected to a W-phase power supply side power transistor receiving a control signal from the small signal system circuit, wherein the U-phase, V-phase, and W-phase power supply side power transistors are arranged along a second direction orthogonal to the first direction;

the group of ground side power transistors including:
- a U-phase ground side power transistor having a collector region connected to the U-phase output node, an emitter region connected to the ground potential node, and a base region receiving a control signal from the small signal system circuit;
- a V-phase ground side power transistor having a collector region connected to the V-phase output node, an emitter region connected to the ground potential node, and a base region receiving a control signal from the small signal system circuit;
- a W-phase ground side power transistor having a collector region connected to the W-phase output node, an emitter region connected to the ground potential node, and a base region receiving a control signal from the small signal system circuit, the U-phase, V-phase, and W-phase ground side power transistors being arranged along the second direction; and
- an island comprising part of the epitaxial layer disposed between the power supply source side power transistor and the ground side power transistor and surrounded by a p-type separating region extending through the epitaxial layer to the semiconductor substrate and electrically connected to a ground potential node.

21. The semiconductor integrated circuit device according to claim 20 wherein the group of power supply side power transistors is located closer to the small signal system circuit than is the group of ground side power transistors.

22. The semiconductor integrated circuit device according to claim 21 wherein the island extends along sides of the ground side power transistor in a U-shape.

23. The semiconductor integrated circuit device according to claim 21 wherein the group of ground side power transistors is located proximate an end of the semiconductor substrate.

24. The semiconductor integrated circuit device according to claim 21 wherein:
each power supply side power transistor on the power supply source side is located on a region of the epitaxial layer surrounded by the p-type separating region extending through the epitaxial layer from the semiconductor substrate;
each ground side power transistor is located on a part of the epitaxial layer surrounded by the p-type separating region extending through the epitaxial layer from the semiconductor substrate; and
the p-type separating region between the group of power supply side power transistors and the group of ground side power transistors is electrically connected to the ground potential node.

25. A semiconductor integrated circuit device for driving a motor, the device comprising:
a p-type semiconductor substrate and an n-type epitaxial layer disposed on the semiconductor substrate and having first and second areas arranged along a first direction;
a power transistor group located in the first area;
a small signal system circuit located in the second area and including at least one transistor wherein:
the power transistor group comprises a power supply side power transistor and a ground side power transistor, the ground side power transistor including a collector region connected to a first output node, an emitter region connected to a ground potential node, and a base region receiving control signals from the small system signal circuit;
the power supply side power transistor includes a collector region connected to a power supply source node, an emitter region connected to a second output node, and a base region receiving a control signal from the small signal system circuit, wherein the power supply side power transistor and the ground side power transistor are located along the first direction and the power supply side power transistor is located closer to the small signal system circuit than is the ground side power transistor;
the power supply side power transistor and the ground side power transistor are arranged along the first direction and the power supply side power transistor is located closer to the small signal system circuit than the ground side power transistor;
the power supply side power transistor is located on a part of the epitaxial layer surrounded by a p-type separating region extending through the epitaxial layer from the semiconductor substrate;
the ground side power transistor is located on a part of the epitaxial layer surrounded by the p-type separating region extending through the epitaxial layer from the semiconductor substrate; and
the p-type separating region surrounding the ground side power transistor is electrically connected to the ground potential node.

26. A semiconductor integrated circuit device for driving a motor, the device comprising:
a p-type semiconductor substrate and an n-type epitaxial layer disposed on the semiconductor substrate and having first and second areas arranged along a first direction;
a small signal system circuit located in the second area and including at least one transistor;
a power transistor group located in the first area of the semiconductor substrate and including a group of power supply side power transistors and a group of ground side power transistors, arranged along the first direction, the group of power supply side power transistors being located closer to the small signal system circuit than the group of ground side power transistors, the group of power supply side power transistors including:
- a U-phase power supply side power transistor having a collector region connected to a power supply source node, an emitter region connected to a U-phase output node connected to a U-phase terminal of a motor, and a base region connected to a U-phase power supply side power transistor receiving a control signal from the small signal system circuit;
- a V-phase power supply side power transistor having a collector region connected to a power supply source node, an emitter region connected to a V-phase output node connected to a V-phase terminal of the motor, and a base region connected to a V-phase power supply side power transistor receiving a control signal from the small signal system circuit;
- a W-phase power supply side power transistor having a collector region connected to a power supply source node, an emitter region connected to a W-phase output node connected to a W-phase terminal of the motor, and a base region connected to a W-phase power supply side power transistor receiving a control signal from the small signal system circuit, wherein the U-phase, V-phase, and W-phase power supply side power transistors are arranged along a second direction orthogonal to the first direction;

the group of ground side power transistors including:
- a U-phase ground side power transistor having a collector region connected to the U-phase output node, an emitter region connected to the ground potential node, and a base region receiving a control signal from the small signal system circuit;
- a V-phase ground side power transistor having a collector region connected to the V-phase output node, an emitter region connected to the ground potential node, and a base region receiving a control signal from the small signal system circuit;
- a W-phase ground side power transistor having a collector region connected to the W-phase output node, an emitter region connected to the ground potential node, and a base region receiving a control signal from the small signal system circuit, the U-phase, V-phase, and W-phase ground side power transistors being arranged along the second direction wherein:

each power supply side power transistor is located in a region of the epitaxial layer surrounded by a p-type separating region extending through the epitaxial layer to the semiconductor substrate;

each ground side power transistor is located in a region of the epitaxial layer surrounded by the p-type separating region extending through the epitaxial layer to the semiconductor substrate; and the p-type separating region surrounding the ground side power transistors is electrically connected to the ground potential node.

* * * * *